United States Patent [19]
Elkin et al.

[11] Patent Number: 5,263,587
[45] Date of Patent: Nov. 23, 1993

[54] INFLATABLE PACKAGING POUCH

[75] Inventors: Alfred A. Elkin, Pawtucket; Richard N. Duffany, Warwick, both of R.I.; William S. Duarte, Seekonk, Mass.

[73] Assignee: Plastic Development, Inc., Pawtucket, R.I.

[21] Appl. No.: 937,115

[22] Filed: Aug. 31, 1992

[51] Int. Cl.⁵ .............................................. B65D 81/00
[52] U.S. Cl. .................................... 206/522; 206/328; 383/3
[58] Field of Search ................ 137/223, 232; 206/328, 206/334, 522; 383/3

[56] References Cited

U.S. PATENT DOCUMENTS

| | | | |
|---|---|---|---|
| 4,099,656 | 7/1978 | Neumann et al. | 383/3 |
| 4,262,801 | 4/1981 | Avery | 206/522 |
| 4,551,379 | 11/1985 | Kerr | 206/522 |

Primary Examiner—Jimmy G. Foster
Attorney, Agent, or Firm—Salter, Michaelson & Benson

[57] ABSTRACT

An inflatable pouch for packaging a circuit board is formed from two superposed sheets of an electrostatically dissipative plastic. The plastic sheets are welded together to form two air chambers therebetween, each having a plurality of passages therein and they are folded over along a transverse centerline so as to form a bottom end along the centerline, an open end opposite the bottom end and opposing front and rear walls. The side portions of the front and rear walls are welded together to form the side edges of the pouch. The passages in the front wall adjacent the open end of the pouch include enlarged portions which are transversely offset from and interengageable with corresponding enlarged portions in the rear wall to prevent a circuit board from sliding out the top of the pouch. Both air chambers are inflatable through a single inlet aperture which is sealable with a clamp.

6 Claims, 5 Drawing Sheets

INFLATABLE PACKAGING POUCH

BACKGROUND OF THE INVENTION

The instant invention relates to packaging materials and more particularly to an inflatable packaging pouch for packaging fragile articles, such as printed circuit boards.

Heretofore circuit boards have normally been packaged in cardboard containers filled with styrofoam packaging "peanuts" or "bubble" wrap to protect the printed circuit boards from physical impacts. It has been found that this type of packaging material is extremely wasteful and that the plastic and styrofoam materials used therein are also extremely harmful to the environment when disposed of in landfills. Because of the problems associated with the disposal of non-reusable packaging materials, such as styrofoam "peanuts" and plastic "bubble" wrap, regulations restricting the use of such packaging materials have recently been proposed. These pending regulations would require future packaging materials to be reusable a specified number of times, i.e. reusable five or six times before they can be discarded. Accordingly, these pending regulations have created a need for an inexpensive, but reusable packaging material for packaging fragile materials.

Inflatable packaging materials have heretofore been known in the art. In this regard, the U.S. Pat. No. to Kerr 4,551,379 represents the closest prior art to the subject invention of which the applicant is aware. The patent to Kerr discloses an inflatable packaging material formed from a pair of juxtaposed sheets of plastic, such as nylon or polyethylene. The sheets are welded together to form a packaging material having a plurality of continuous passages therein which extend between opposite edges thereof. The passages may be permanently sealed during manufacture or may include a manifold assembly for selectively inflating and deflating the material.

SUMMARY OF THE INVENTION

The instant invention provides an inflatable packaging pouch for use in packaging printed circuit boards.

Briefly, the inflatable packaging pouch of the subject invention comprises two superposed sheets of an electrostatic dissipative plastic which are welded together to form two separate air chambers and an inlet portion for each air chamber. The air chambers have a plurality of passages therein which are bounded by spaced weld lines. The plastic sheets are folded over along a transverse centerline so as to form a bottom end along the centerline, an open end opposite the bottom end and opposing front and rear walls. The adjacent side edge portions of the front and rear walls are welded together to form side edges of the pouch. The passages adjacent the open end of the pouch are formed to include transversely offset enlarged portions which interengage to prevent the circuit board from sliding out the top of the pouch. The inlet portions of the air chambers are superposed when the plastic sheets are folded over on one another, and they are welded together to form a single aperture through which both air chambers can be filled. The aperture is sealed closed with suitable means, such as a hinged clamp.

Accordingly it is an object of the instant invention to provide an inflatable packaging pouch for packaging fragile materials.

It is another object of the invention to provide an inflatable packaging pouch which is reusable.

It is yet another object to provide an inflatable packaging pouch having two separate air filled chambers.

It is still another object to provide an inflatable packaging pouch in which the two separate air chambers are inflatable through a single inlet aperture.

It is still yet another object to provide an inflatable pouch in which the end portions of the passages on opposite walls of the open end of the pouch are enlarged and offset from one another to provide a closure means at the open end thereof.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
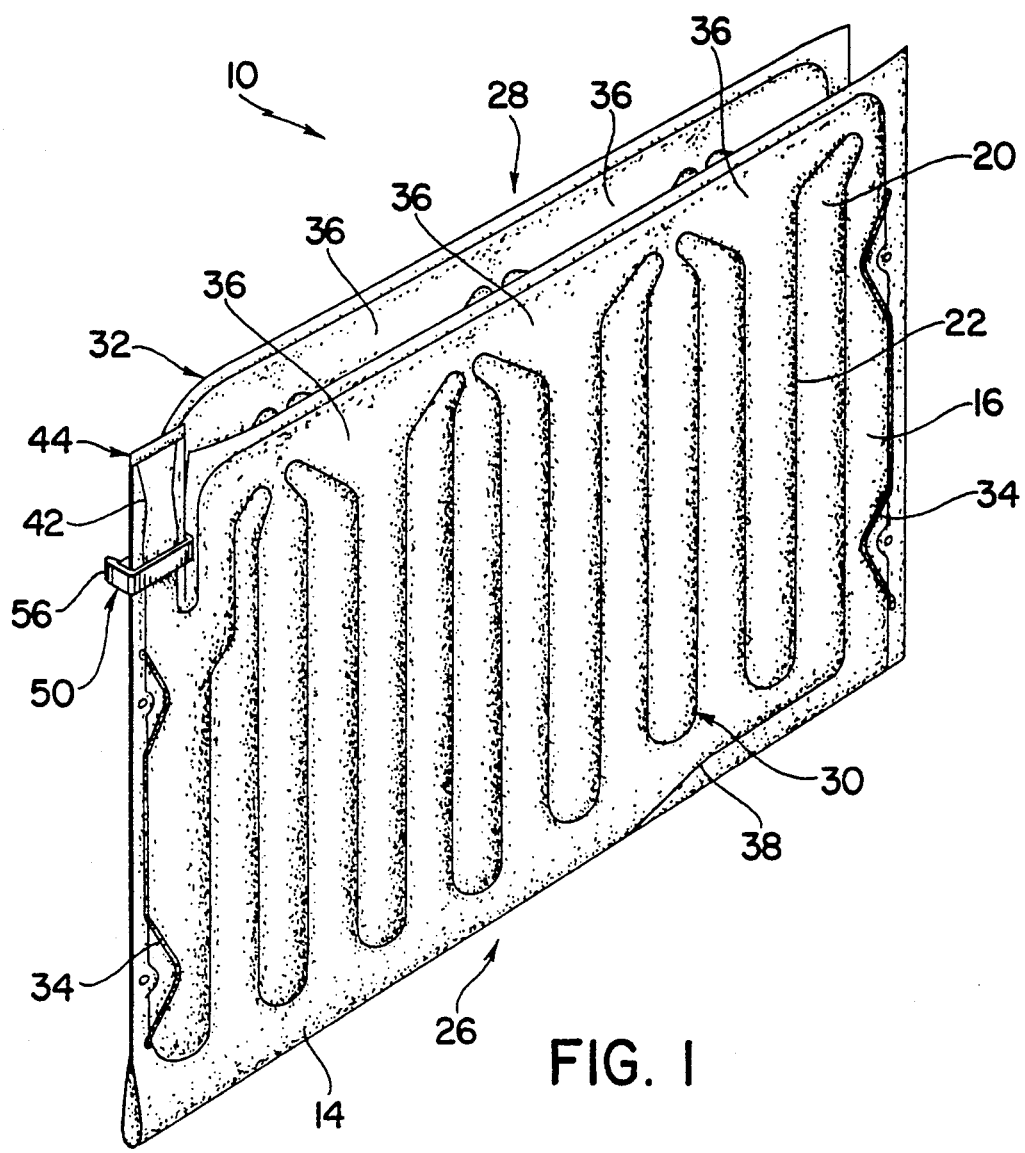
FIG. 1 is a perspective view of the inflatable packaging pouch of the instant invention.
Figure 2:
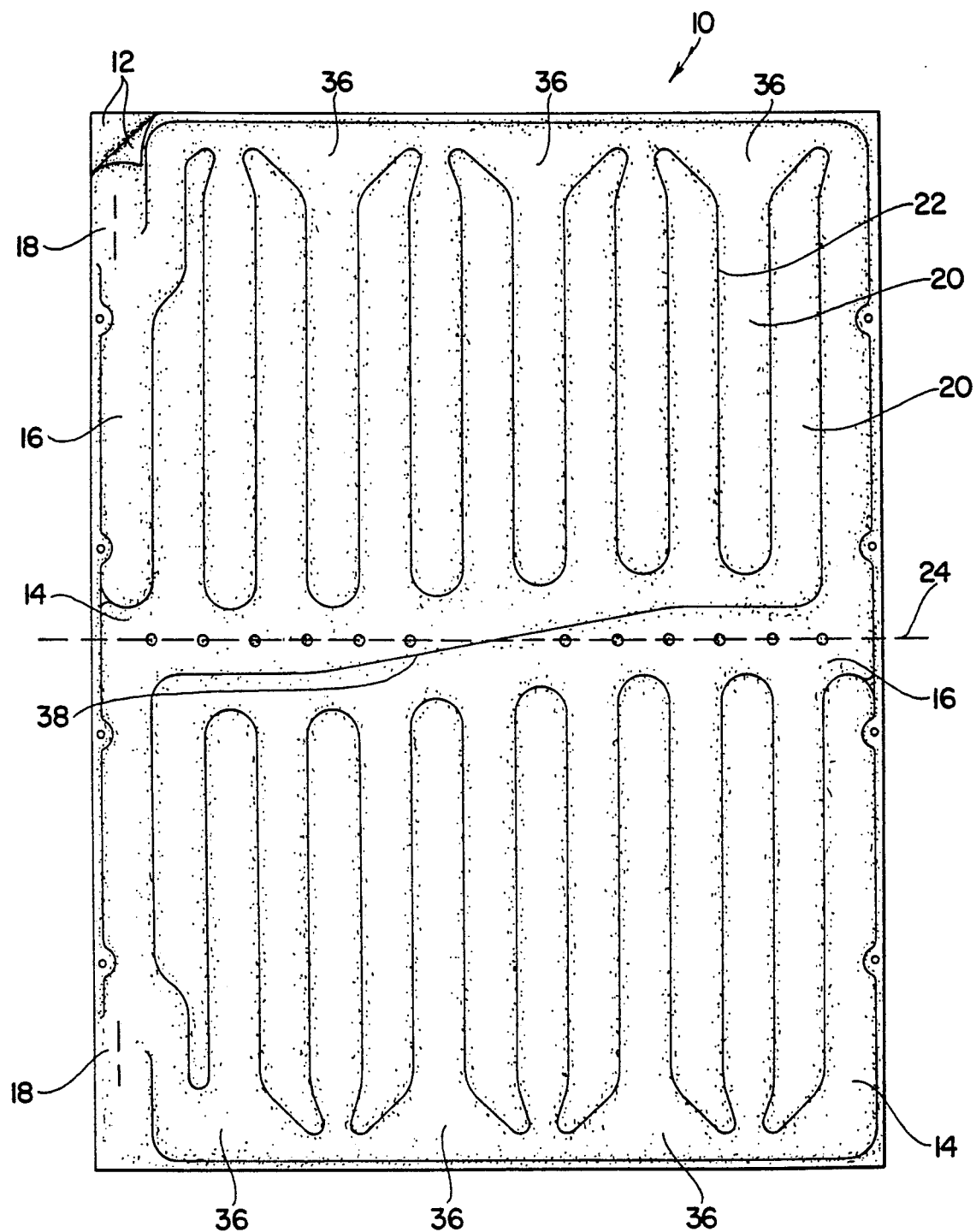
FIG. 2 is a plan view thereof with the pouch unfolded to show the two separate air chambers thereof.
Figure 3:
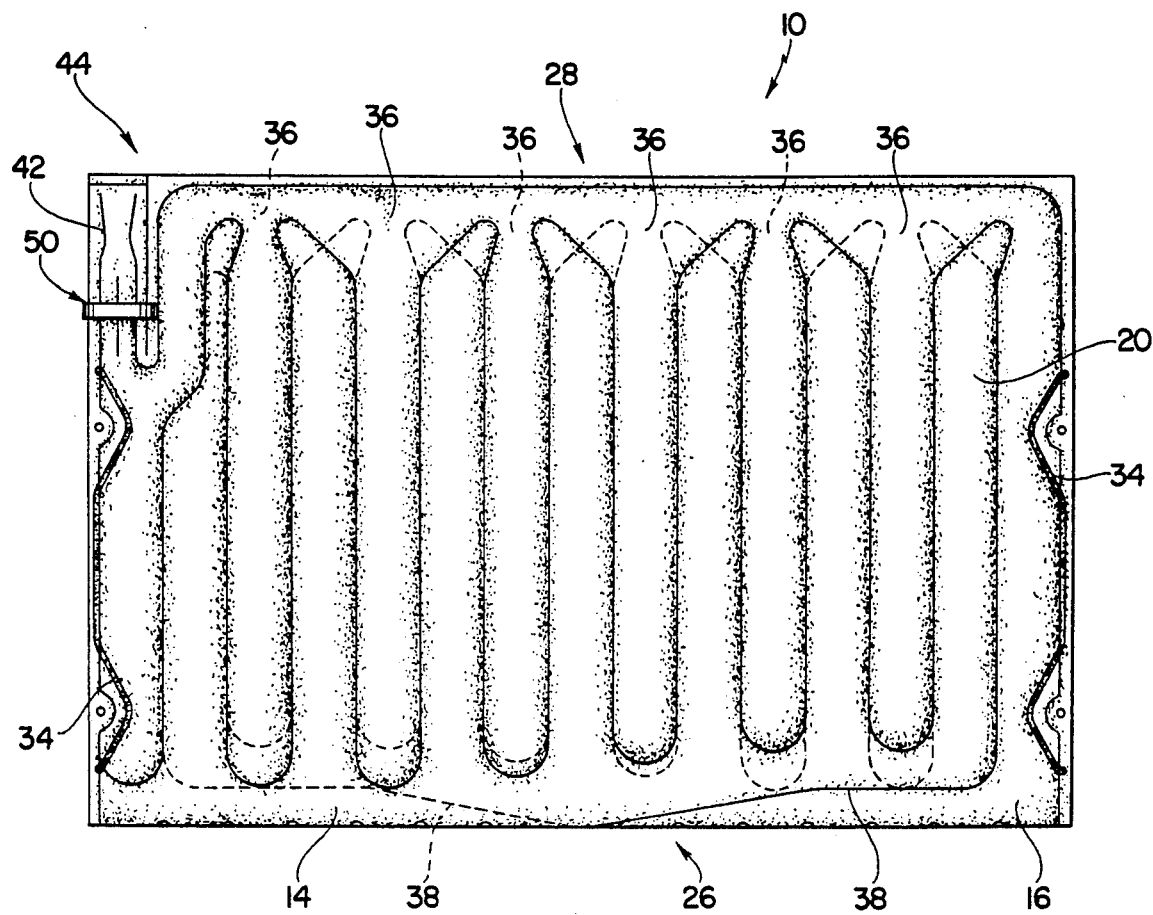
FIG. 3 is a front view thereof.
Figure 6:
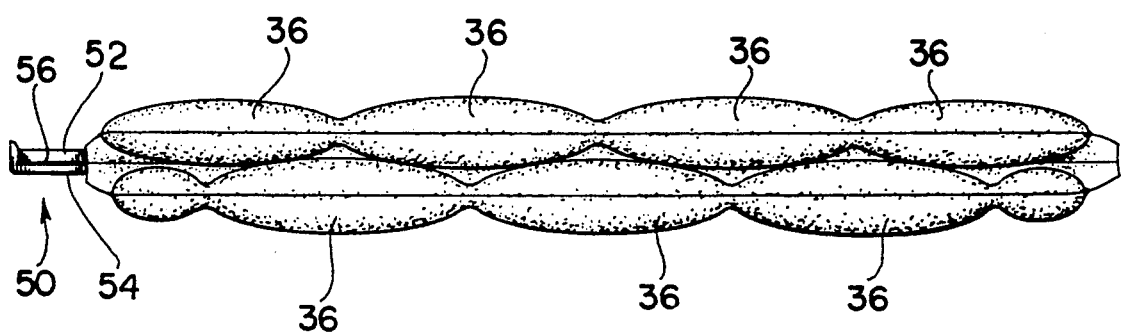
FIG. 6 is a top view of the pouch showing the transversely offset chamber portions.

Referring now to the drawings, the inflatable packaging pouch of the instant invention is illustrated, and it is generally indicated at 10 in FIGS. 1, 2 and 3. In FIG. 2, the pouch 10 is illustrated in an unfolded form, and as will be seen, it comprises two superposed flexible plastic sheets 12 which are welded together to form two separate air chambers, 14 and 16 respectively, therebetween and an inlet portion 18 for each air chamber. The plastic sheets 12 are preferably approximately 5.5 thousandths of an inch thick and they comprise a polyurethane plastic alloy which is operative for dissipating electrostatic charges. Alternatively, if electrostatic dissipative capabilities are not required, plastic sheets of other compositions can be utilized. Preferably each sheet of plastic individually comprises two 2.75 thousandths of an inch thick sheets which are laminated together to form the thicker sheet. This manner of manufacturing strengthens the plastic sheets to prevent punctures. The plastic sheets 12 are welded together by any suitable welding process, such as by heat sealing or electronic welding. The air chambers 14 and 16 are formed to include a plurality of side-by-side passages 20 which are bounded by spaced weld lines 22 extending between the sides of the plastic sheets 12. The air chambers 14 and 16 and the passages 20 are arranged so that adjacent passages comprise part of opposite chambers, 14 and 16, i.e. adjacent passages are alternately formed from chamber 1, chamber 2, chamber 1, etc. The plastic sheets 12 include a transverse centerline 24 along which the plastic sheets are folded over (FIGS. 1 and 3) to form a closed bottom end generally indicated at 26, an open top end generally indicated at 28 and opposing front and rear walls generally indicated at 30 and 32, respectively. The front and rear walls 30 and 32 have side edge portions which are welded together by weld lines 34 so as to form the opposite side edges of the pouch 10. Adjacent the open top end 28 of the pouch 10, the passages 20 on opposing front and rear walls 30 and 32 are formed to include enlarged transversely offset portions 36 which matingly interengage to prevent an article from sliding out the open top end 28 (see FIG. 6). Referring again to FIG. 2, the air chambers 14 and 16 are separated at the bottom end of the pouch by an angled weld line 38 which extends from one side of the centerline 24 to the other side of the centerline 24 and generally passes through a midpoint thereof. The angled weld line 38 promotes better filling of the chambers 14 and 16 when the sheets 12 are folded over and welded together at the side edges thereof.

Figure 4:
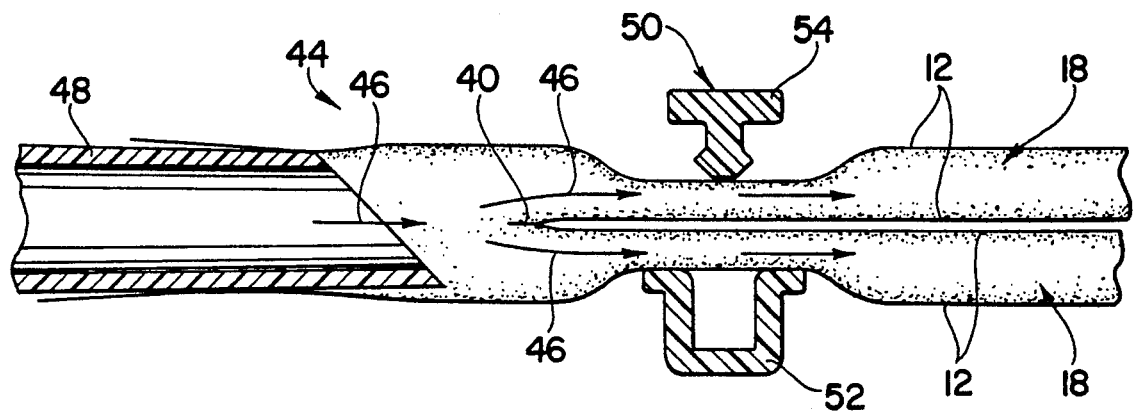
FIG. 4 is an enlarged view of the air chamber inlets and the clamp therefor in the open position to allow filling of the chambers.

The inlet portions 18 of the air chambers 14 and 16 are formed on opposite sides of the centerline 24 so that they become superposed when the plastic sheets are folded over along the centerline. In this regard, as illustrated in FIG. 4, the two inside layers of the plastic sheets 12 are welded together at their terminal ends 40. As illustrated in FIGS. 1 and 3, all four layers of the plastic sheets 12 are welded together around their peripheral edges at weld lines 42 so that one inlet aperture is formed therefrom as generally indicated at 44. This structure allows both of the air chambers 14 and 16 to be filled from a single aperture 44. Further, because the inner layers of the plastic sheets 12 are welded together at their terminal ends the inner layers are prevented from flapping up and down when air, indicated by arrows 46, is injected through the aperture 44 by a filling device 48.

Figure 5:
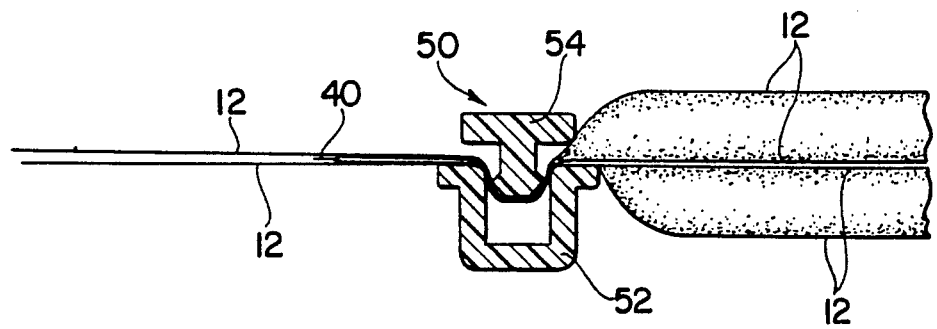
FIG. 5 is a similar view thereof with the clamp in the closed position.

The inlet aperture 44 is sealed by a hinged pressure clamp generally indicated at 50. The clamp 50 includes a lower channel shaped jaw portion 52 and an upper jaw portion 54 which matingly interengage to compress the layers of plastic 12 together. The lower and upper jaw portions 52 and 54 are connected by a hinge at one end thereof and the upper jaw 54 portion is formed with a tab portion 56 (See FIG. 1) which interlocks with the lower jaw portion 52 to secure the clamp 50 in a closed position. As can be seen FIG. 5, it is important that there be at least some slack in the plastic sheets 12 when the clamp 50 is closed so that the plastic sheets 12 are not stretched when the jaw portions 52 and 54 interengage. In this regard, such stretching could potentially damage the plastic sheets 12 over a period of time and could eventually cause a leak in the pouch. The lower jaw portion 52 is preferably permanently attached to the pouch so that it is readily available for closing the inlet aperture 44.

It is seen therefore that the instant invention provides an effective packaging material for packaging printed circuit boards. In use, the pouch 10 is inflated and a printed circuit board is placed therein. The pouch 10 with the printed circuit board therein can then be placed inside a cardboard container with other pouches and circuit boards for shipping. During shipping, the pouch 10 is effective for preventing damage to the circuit board contained therein and because it is made from an electrostatically dissipative material it is capable of protecting the circuit board therein from damage as a result of static discharge. The offset enlarged portions located at the open end of the pouch prevent a circuit board therein from sliding outwardly of the pouch when it is packaged inside a cardboard container. The plastic pouch is durable enough so as to be reusable over an extended period of time and it is designed so that both air chambers can be filled through a single aperture. The hinged clamp allows the pouch to be selectively inflated and deflated. For these reasons it is believed that the instant invention provides a significant advancement in the art.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An inflatable pouch comprising:
   two superposed flexible plastic sheets which are welded together to form first and second air chambers therebetween, said first and second air chambers each including a plurality of parallel passages which are bounded by spaced weld lines in said sheets and a respective inlet portion for inflating said respective chamber, said plastic sheets having a transverse centerline and being folded over at said centerline so as to form a bottom end along said centerline, an open top end opposite said bottom end and opposing front and rear walls, said front and rear walls having adjacent side portions which are welded together to form side edges, said parallel passages in said first and second air chambers being arranged so that adjacent passages in said front wall and adjacent passages in said rear wall comprise alternating sections of said first and second air chambers; and
   means for sealing said inlet portions.

2. In the inflatable pouch of claim 1, said first and second air chambers being separated by an angled weld line which extends from said front wall across said centerline to said rear wall, said angled weld line intersecting said centerline at a midpoint thereof.

3. An inflatable pouch comprising:
   two superposed flexible plastic sheets which are welded together to form an air chamber therebetween and an inlet portion for inflating said air chamber, said air chamber including a plurality of passages which are bounded by spaced weld lines in said sheets, said plastic sheets having a transverse centerline and being folded over at said centerline so as to form a bottom end along said centerline, an open top end opposite said bottom end and opposing front and rear walls of said pouch, said front and rear walls having adjacent side portions which are welded together to form side edges of said pouch; and
   means for sealing said inlet portion, said plastic sheets comprising a polyurethane alloy which is operative for dissipating electrostatic charges.

4. An inflatable pouch comprising:
   two superposed flexible plastic sheets which are welded together to form an air chamber therebetween and an inlet portion for inflating said air chamber, said air chamber including a plurality of passages which are bounded by spaced weld lines in said sheets, said plastic sheets having a transverse centerline and being folded over at said centerline so as to form a bottom end along said centerline, an open top end opposite said bottom end and opposing front and rear walls of said pouch, said front and rear walls having adjacent side portions which are welded together to form side edges of said pouch; and clamp means for sealing said inlet portion.

5. An inflatable pouch comprising:

two superposed flexible plastic sheets which are welded together to form two separate air chambers therebetween and a single inlet aperture, both of said air chambers being inflatable through said inlet aperture, each of said air chambers including a plurality of passages which are bounded by spaced weld lines in said sheets, said plastic sheets having a transverse centerline and being folded over at said centerline so as to form a bottom end along said centerline, an open top end opposite said bottom end and opposing front and rear walls of said pouch, said front and rear walls having adjacent side portions which are welded together to form side edges of said pouch; and means for sealing said inlet portions.

6. An inflatable pouch comprising:

two superposed flexible plastic sheets which are welded together to form two separate air chambers therebetween, each of said air chambers including a plurality of passages which are bounded by spaced weld lines in said sheets and a respective inlet portion for inflating said respective chamber, said plastic sheets having a transverse centerline and being folded over at said centerline so as to form a bottom end along said centerline, an open top end opposite said bottom end and opposing front and rear walls of said pouch, said front and rear walls having adjacent side portions which are welded together to form side edges of said pouch, said inlet portions being formed on opposite sides of said centerline and being superposed on one another, said inlet portions beings welded together to form a single inlet aperture though which both air chambers can be filled simultaneously; and means for sealing said inlet portions.

* * * * *